(12) United States Patent
Waizman et al.

(10) Patent No.: US 6,392,301 B1
(45) Date of Patent: May 21, 2002

(54) CHIP PACKAGE AND METHOD

(75) Inventors: Alex Waizman, Zichron Yaakov (IL); Chee-Yee Chung, Chandler; Bob Sankman, Phoenix, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/426,394

(22) Filed: Oct. 25, 1999

(51) Int. Cl.[7] .................. H01L 23/48; H01L 29/40; H05K 7/02; H01R 9/09
(52) U.S. Cl. .................. 257/774; 257/737; 257/738; 257/778; 257/700; 257/701; 257/758; 174/266; 174/255; 361/760; 361/794; 428/209; 29/843; 29/840
(58) Field of Search .................. 257/678, 680, 257/774, 737, 738, 778, 700, 701, 758, 658, 693, 692; 361/760, 797; 174/266, 255; 428/209; 29/843, 840, 853

(56) References Cited

U.S. PATENT DOCUMENTS

| | | | | |
|---|---|---|---|---|
| 4,617,730 A | * | 10/1986 | Geldermans et al. | 29/843 |
| 5,615,477 A | * | 4/1997 | Sweitzer | 361/743 |
| 5,854,534 A | * | 12/1998 | Beilin et al. | 257/700 |
| 5,883,335 A | * | 3/1999 | Mizumoto et al. | 257/774 |
| 5,994,771 A | * | 11/1999 | Sasaki et al. | 257/700 |
| 6,051,867 A | * | 4/2000 | Theil et al. | 257/774 |
| 6,107,109 A | * | 8/2000 | Akram et al. | 438/15 |
| 6,114,019 A | * | 9/2000 | Bhatt et al. | 174/262 |
| 6,229,209 B1 | * | 5/2001 | Nakamura et al. | 257/737 |
| 6,239,495 B1 | * | 5/2001 | Sakui et al. | 257/737 |

* cited by examiner

Primary Examiner—Alexander O. Williams
(74) Attorney, Agent, or Firm—Schwegman, Lundberg, Woessner & Kluth P.A.

(57) ABSTRACT

A semiconductor device package includes multiple build-up layers of metal sandwiching non-conductive layers. The metal layers include apertures, or degassing holes. A manual method and a computer-implemented method for designing the semiconductor device packages includes stepping polygons across a representation of a conductive layer. A signal routing layer that includes signal traces is then superimposed on the conductive layer. Signal traces overlap the polygons creating regions of intersection that can be enlarged. Regions of intersection are removed from the polygons and the remaining polygon area is designated as apertures in the conductive layer. A semiconductor device package and packaged integrated circuit includes apertures in a conductive layer such that the apertures generally form a radial pattern outward from a region on the package. Signal traces also traverse the package generally radially outward such that the traces and the apertures do not overlap. Impedance variations decrease due to the decreased variation in the number of degassing holes passed over or under by trace.

33 Claims, 5 Drawing Sheets

CHIP PACKAGE AND METHOD

FIELD

The present invention relates generally to computer board and chip packaging, and more specifically to chip package design and manufacturing.

BACKGROUND

As input/output (I/O) speed and the total number of I/Os required for high performance semiconductor chips have increased dramatically, the need for increased numbers of interconnect lines with low line impedance variation in chip packages has increased as well. To address this need, manufacturers have used multi-layered packages where several layers of conductors are separated by layers of dielectric material.

In printed circuit board (PCB) and integrated circuit (IC) manufacture, often semiconductor dice are to be connected to a motherboard. Typically, a die is connected to a package, which is in turn connected to a motherboard. The motherboard typically receives multiple packages, thereby providing electrical connections between multiple semiconductor chips. One manner in which circuit dice can be mounted to a package is to "flip mount" the die to a small board designed to receive the die. When flip mounted, the die couples electrical signals to the package without the use of bond wires.

The package can have a core made of a common material such as glass epoxy, and can have additional layers laminated onto the core. These additional layers are also known as "build-up" layers. The build-up layers are typically formed from alternating layers of dielectric material and conductive material. Patterns may be built in the metal or conductive layer through various etching processes such as wet etching which are known in the art and will not be described further herein. Plated through holes called vias are used to make interconnects between various layers of metal. Using these layers and vias, several layers of interconnections may be built up.

Input/Output functions are typically accomplished using metal traces within the layers. Each trace has an impedance generated by its geometry and location in the package. Due to the manufacturing technology and material requirements, packages having build-up layers often include a number of degassing holes in the metal layers. Degassing holes allow gas to be evaporated from dielectric material during the manufacture of the package so that bubbles do not form in the package.

Figure 1:
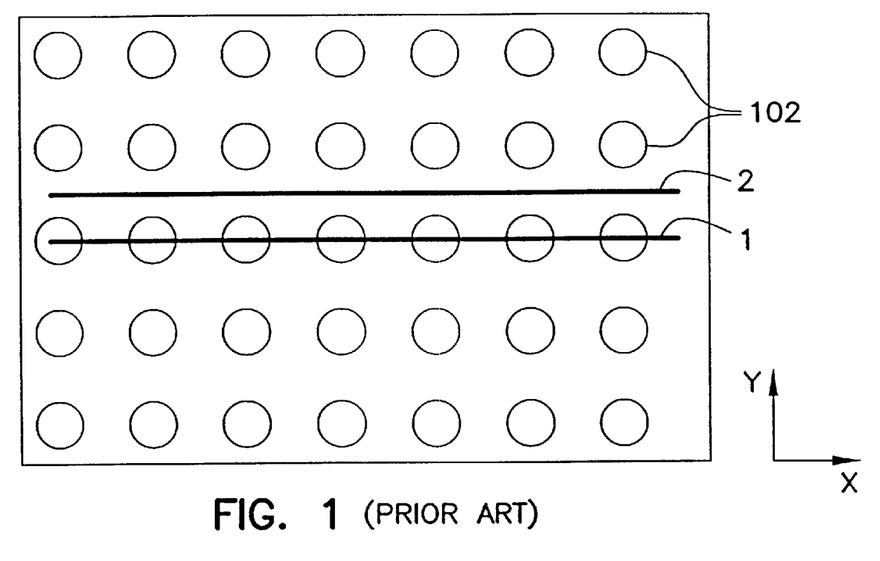
FIG. 1 is a top view of a prior art degassing hole configuration.

Traces may be routed over or under the degassing holes, or around the degassing holes, or a combination thereof. Since the traces are not in the same location on the package, and pass over varying amounts of non-metal areas caused by degassing holes in the metal layers, the traces have an impedance variation, or mismatch. A typical degassing hole pattern has a grid-like array of degassing holes aligned vertically between two layers, as is shown in FIG. 1. In FIG. 1, the degassing holes 102 of the top and bottom layers are exactly aligned in the x and y directions. When traces such as trace 1 and trace 2 are used with a degassing hole alignment scheme as shown in FIG. 1, trace 1 has less metal from the conductive layers both above and below the trace than trace 2, and an impedance variation between the traces results.

For the reasons stated above, and for other reasons stated below which will become apparent to those skilled in the art upon reading and understanding the present specification, there is a need in the art for a semiconductor package having reduced trace impedance variation.

SUMMARY

In one embodiment, a method of specifying the location of a plurality of apertures in a conductive layer includes defining a plurality of polygons on a first plane, where the first plane represents the conductive layer, and the polygons represent candidate locations for apertures in the conductive layer. The method further includes defining a plurality of signal traces on a second plane, where the second plane represents a routing layer to be parallel to the conductive layer, and then superimposing the second plane on the first plane such that at least one signal trace crosses over at least one of the polygons, creating at least one region of intersection. The method further includes removing the at least one region of intersection from the at least one of the plurality of polygons.

In another embodiment, a device package includes a first dielectric layer having a first side and an opposing side, and a plurality of metal traces disposed on the first side of the first dielectric layer, where the plurality of metal traces are routed generally radially outward from a first region on the package. The package further includes a first conductive layer disposed on the opposing side of the first dielectric layer, where the first conductive layer has apertures therethrough, the apertures being positioned generally in a radial pattern outward from the first region, and where the apertures lie between adjacent traces such that the adjacent traces do not overlap the apertures.

DESCRIPTION OF EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 2A:
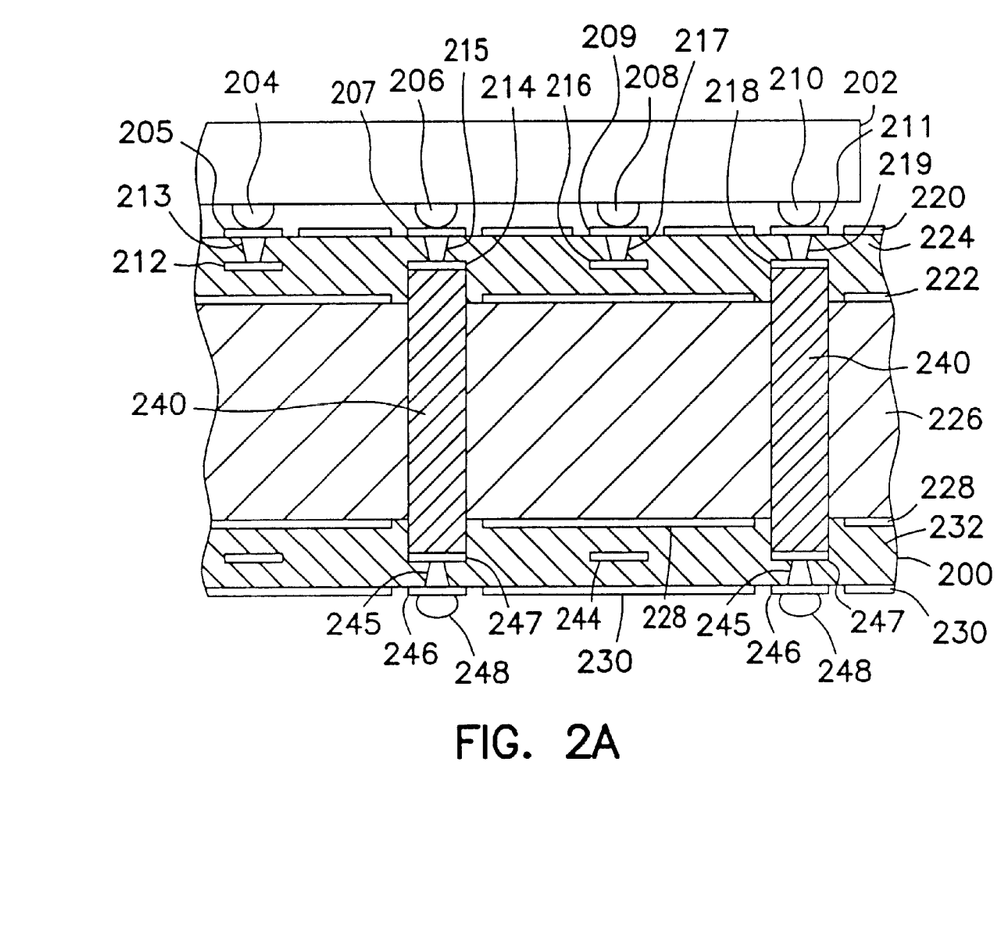
FIG. 2A is a cross section of a semiconductor device and package.

FIG. 2A shows a cross-section of a semiconductor die and package in accordance with one embodiment of the invention. Semiconductor die 202 connects to package 200 at contact points 204, 206, 208, and 210. Signals from semiconductor die 202 propagate through package 200 using various paths. Signals propagate from contact point 204 through pad 205 and via 213 to trace 212. Likewise, signals propagate from contact point 208 through pad 209 and via 217 to trace 216. Signals also propagate from contact points 206 and 210 through pads and vias to traces, shown as pads 207 and 211, vias 215 and 219, and traces 214 and 218. Traces 214 and 218 are in turn coupled to vias 240 in package 200. Vias 240 traverse a portion of package 200, and are coupled to contact points 248 through traces 247, vias 245, and pads 246. Contact points 248 are configured to be coupled to a motherboard, thereby completing the electrical connection from semiconductor die 202 to the motherboard.

Package 200, or a portion thereof, forms a substrate to which various semiconductor die can be affixed. In one embodiment, package 200 is a substrate that is configured to receive a single semiconductor die, such as a microprocessor, and in another embodiment, package 200 is a substrate configured to receive multiple semiconductor dice, such as in the case of a multi-chip module.

Package 200 includes core 226 and build-up layers on both sides of core 226. The build-up layers on top of core 226 include metal layer 222, dielectric layer 224, and metal layer 220. Traces 212 and 216 are also part of the build-up layers on top of core 226. Core 226 is a printed circuit board material, such as glass epoxy. In one embodiment core 226 is made of FR4 material. During manufacturing, metal layer 222 is deposited on core 226, and a portion of dielectric layer 224 is deposited on metal layer 222. A metal layer is then deposited on the dielectric, and is etched to create signal traces 212, 214, 216, and 218. The rest of dielectric layer 224 is then deposited, and then metal layer 220 is deposited. The result is a core material having build-up layers deposited thereupon, where the build-up layers include multiple metal layers and a dielectric layer. Embedded within the dielectric layer is one or more signal layers that carry signal traces. Metal layers 220, 222, and the signal layer embedded therebetween are generally on parallel planes. The embedded signal layers, and their orientation relative to the rest of the package is described in detail with reference to FIGS. 3 and above.

Metal layers 222, 220, 228, and 230 have degassing apertures, or holes, therein. (Not shown in FIG. 2A). During manufacture, the dielectric material gives off a gas, and the degassing holes let the gas escape while keeping the build-up layers intact. The degassing holes, and their orientation relative to the rest of the package is described in detail with reference to FIGS. 3 and above.

The build-up layers shown on the bottom of core 226 in FIG. 2A include metal layer 228, dielectric layer 232, traces 244 and 247, and metal layer 230. Vias 240 are shown protruding through a portion of the bottom build-up layers made up of layers to 228, 232, and 230. At the bottom end of vias 240 are signal traces 247 which are coupled to vias 245, which are in turn coupled to pads 246 and contact points 248. For ease of illustration, FIG. 2A shows a substantially direct vertical connection traversing package 200 from contact points 206 and 210 to contact points 248. Other embodiments include vias that couple contact points 248 to traces within the upper build-up layers, such as trace 216. In another embodiment, at least one via emanates from a trace in the lower build-up layers, such as trace 244, such that the via does not traverse core 226.

Figure 2B:
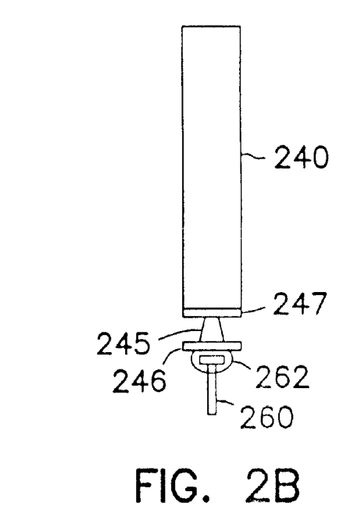
FIG. 2B is an alternate embodiment of a portion of a contact point.

The embodiment shown in FIG. 2A has a ball grid array (BGA) footprint. The BGA footprint is formed by an array of contact points 248 on the bottom of package 200. When package 200 has a BGA footprint, the motherboard typically has an array of pads, each of which is designed to receive one of contact points 248. In another embodiment, shown in FIG. 2B, via 240 is coupled to pin 260 through trace 247, via 245, pad 246, and solder fillet 262. When package 200 includes pin 260 instead of contact point 248, the resulting package has a pin grid array (PGA) footprint. When package 200 has a PGA footprint, the motherboard typically has an array of plated holes, each of which is designed to receive one of pins 260.

Semiconductor die 202 can be any type of integrated circuit, including but not limited to, a microprocessor, digital signal processor, memory, memory controller, application-specific integrated circuit (ASIC), or the like. In the embodiment of FIG. 2A, semiconductor die 202 is flip mounted such that electrically active regions of semiconductor die 202 make contact with contact points 204, 206, 208, and 210. Also, in another embodiment, a package as described above with respect to FIG. 2A can be mounted to a socket on a motherboard. Such a circuit package can also include a processor or other electronic components known to those of ordinary skill in the art.

In other embodiments, the package of the present invention can be used in such configurations as for chipset and processor packaging, and the like. For example, in one embodiment, the method and apparatus of the present invention is incorporated into Land Grid Array (LGA) packages and in Organic Land Grid Array Packages (OLGA). Any processor product using LGA or OLGA packaging technology is capable of implementing one of the embodiments of the present invention.

Figure 3:
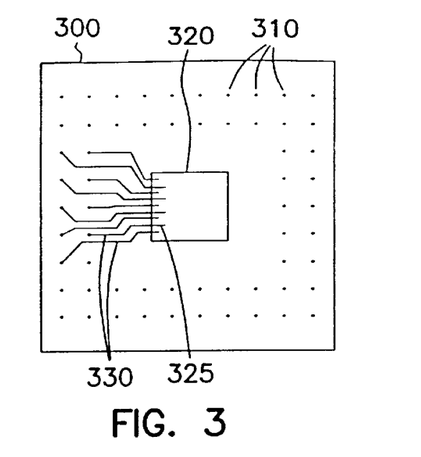
FIG. 3 is a top view of a signal routing layer according to one embodiment of the present invention.

FIG. 3 is a top view of a signal routing layer in accordance with one embodiment of the present invention. Signal routing layer 300 includes die mounting region 320, signal traces 330, and via connections 310. Die mounting region 320 is a region within which a semiconductor die such as semiconductor die 202 (FIG. 2A) can be mounted. Signal traces 330 couple a semiconductor die mounted within die mounting region 320 to via connections 310. For ease of illustration, a relatively small number of signal traces 330 are shown in FIG. 3. One skilled in the art will understand that a very large number of signal traces can exist on routing layer 300. Signal traces 330 generally run from trace ends 325 to vias 310. Trace ends 325 correspond to the ends of traces 212 and 216 which connect to contact points 204 and 208 respectively (FIG. 2A). The opposite ends of traces 330 terminate at vias 310. Vias 310 generally correspond to vias 240 as shown in FIG. 2A.

Signal traces 330 generally run radially outward from die mounting region 320 to vias 310. Signal routing layer 300, as shown in FIG. 3, includes vias 310 about the perimeter of the semiconductor package. In semiconductor packages having high pin counts, vias 310 are not limited to the perimeter of the package, but are instead distributed throughout the package. Signal routing layer 300 corresponds to the layer which include signal traces 212, 214, 216, and 218 (FIG. 2A). When signal routing layer 300 is included a semiconductor device package it is generally sandwiched between dielectric layers, which are in turn sandwiched between two conductive layers. When the dielectric layers are made of resin which can give off a gas, the conductive layers on either side generally include apertures, or degassing holes.

Signal routing layer 300 is shown as a single layer in FIG. 3. When routing layer 300 is a single layer, it resides either above core 226 or below core 226. In an alternate embodiment, signal traces 330 are split between multiple routing layers. When signal traces 330 are split between multiple routing layers, vias can exist throughout the semiconductor package to move signal traces from one layer to the next. In one embodiment, shown in FIG. 3, signal traces 330 have equal widths and traverse signal routing layer 300 at regular angles. In another embodiment, signal traces 330 traverse routing layer 300 at irregular angles and become narrower as they approach die mounting region 320.

Signal routing layer 300 shows a single die mounting region 320. This corresponds to a semiconductor device package designed to receive a single semiconductor die. The various embodiments of the present invention are also applicable to substrates designed to receive multiple semiconductor die. When a substrate incorporating signal routing layer 300 is capable of receiving multiple semiconductor die, multiple die mounting regions 320 can exist. For example, in a multi-chip module, multiple die mounting regions 320 can exist, each configured to receive a semiconductor die. In the multi-chip module embodiment, signal traces 330 also couple the various die mounting regions 320, and are not limited to coupling die mounting regions 320 to vias 310.

Figure 4:
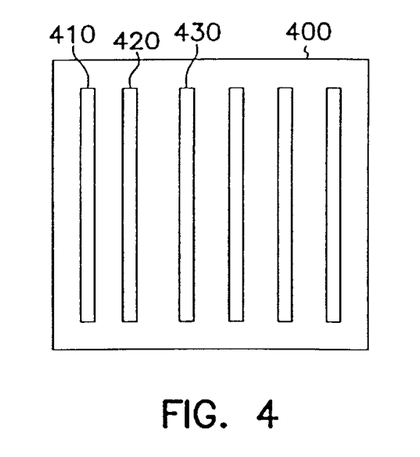
FIG. 4 is a top view of a partially complete conductive layer according to one embodiment of the present invention.

FIG. 4 is a top view of a partially complete conductive layer in accordance with an embodiment of the present invention. Conductive layer 400, as shown in FIG. 4, represents the state of a conductive layer in a partially complete design process. Conductive layer 400 includes multiple polygons, three of which are labeled 410, 420, and 430. Conductive layer 400 represents a small portion of an entire conductive layer such as conductive layer 220 or conductive layer 222 (FIG. 2A). The polygons on conductive layer 400 represent possible locations for apertures, or degassing holes.

In one embodiment, the polygons are all the same shape. In the embodiment shown in FIG. 4, the polygons are rectangles. The rectangles have a major dimension running vertically, and a minor dimension running horizontally. To create the state of the design illustrated in FIG. 4, polygons are stepped across conductive layer 400 in the direction of the minor dimension of the polygons, such that the major dimensions of the polygons are substantially parallel. When the design of apertures in conductive layer 400 is performed manually, or without computers, polygons can be drawn directly on conductive layer 400, or can be drawn on paper which represents a conductive layer. When the design is automated, or performed by a computer, physical manifestations of conductive layer 400 having polygons thereon need not exist; instead virtual manifestations can exist in data structures in memory or other storage.

Figure 5A:
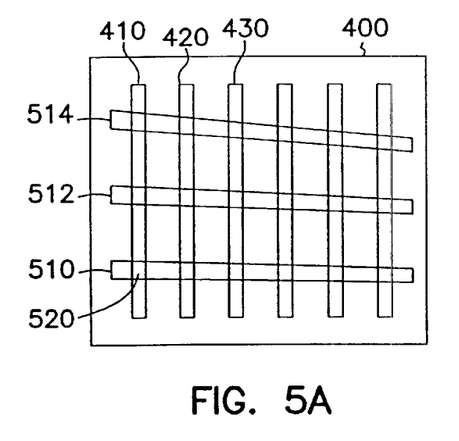
FIG. 5A is a top view of a signal layer superimposed on a partially complete conductive layer according to one embodiment of the present invention.

FIG. 5A shows conductive layer 400 in a different state of the design process. Conductive layer 400 still includes polygons such as polygons 410, 420, and 430. Also shown in FIG. 5A are signal traces 510, 512, and 514. Signal traces 510, 512, and 514 generally correspond to signal traces 330 on signal routing layer 300 (FIG. 3). Signal traces 510, 512, and 514 are not actually on conductive layer 400, but rather are superimposed thereon for the purposes of determining proper aperture location and size. When design and manufacturing are complete, conductive layer 400 and the signal layer which includes signal traces 510, 512, and 514 are separated by at least one layer of a dielectric material. As signal traces 510, 512, and 514 traverse the package generally radially outward as previously described, they cross polygons. Areas of intersection 520 are created at the intersection of polygons and signal traces.

Figure 5B:
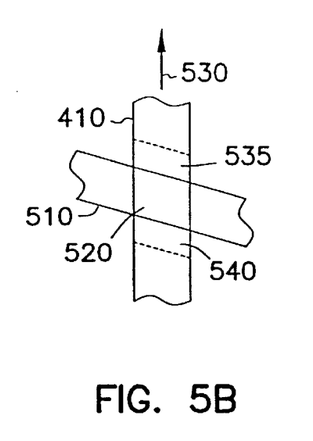
FIG. 5B is a top view of a region of intersection according to one embodiment of the present invention.

FIG. 5B shows a close-up of region of intersection 520. Region of intersection 520 is created by the overlap of polygon 410 and signal trace 510. In one embodiment, region of intersection 520 is removed from the polygon such that there is no longer overlap between what remains of the polygon and the signal trace. In another embodiment, region of intersection 520 is expanded prior to being removed from a polygon. This is shown in FIG. 5B by areas of expansion 535 and 540. Generally, when the region of intersection is expanded, it is done so in the direction of the major dimension 530 of the polygon being crossed. In this embodiment, areas of expansion 535 and 540 are combined with region of intersection 520 to expand region of intersection 520 in the direction of major dimension 530. When enlarged regions of intersection are removed from polygons, additional clearance is created between signal traces and polygons. In addition, when regions of intersection are removed from polygons, only segments of the original polygons remain. This reduces the amount of area on the conductive layer as candidate locations for apertures. In one embodiment, for any given region of intersection 520, areas of enlargement 535 and 540 are substantially equal in size. In this embodiment, the remaining polygons are substantially equidistant from the signal trace. In areas of the package where traces are densely packed together, areas of enlargement 535 and 540 are relatively small in order to allow for the remaining polygons to be sufficient in size for degassing purposes. In other areas of the package, where traces are not so densely packed, areas of enlargement 535 and 540 can be much larger while still allowing sufficient remaining polygon area.

Figure 6:
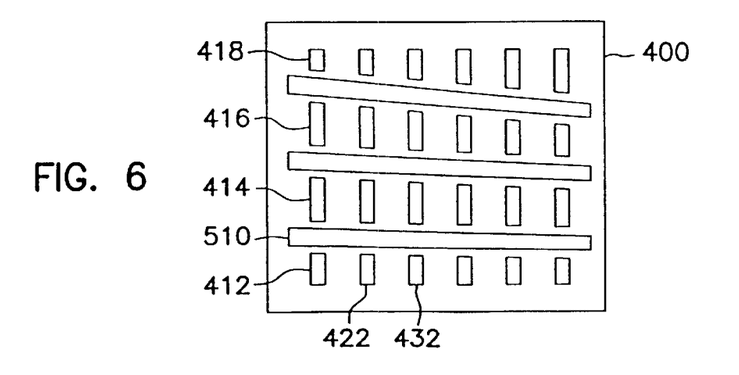
FIG. 6 is a top view of a degassing hole configuration in accordance with one embodiment of the present invention.

FIG. 6 is a top view of a degassing hole configuration in accordance with one embodiment of the present invention. As shown in FIG. 6, conductive layer 400 includes polygons that have had enlarged regions of intersection removed. For example, polygons 412, 414, 416, and 418 are polygons which have been created from polygon 410 (FIG. 5A) by the removal of enlarged regions of intersection 520 (FIG. 5B). Likewise, polygons 422 and 432 are pieces of original polygons 420 and 430 respectively. These remaining polygons on conductive layer 400 are designated as aperture locations such that when the device is manufactured, holes in conductive layer 400 will occur at the polygon locations. The aperture locations on conductive layer 400 are such that the apertures are positioned in a radial pattern outward from the die mounting region. The apertures lie between the signal traces which are also generally in a radial pattern outward from the die mounting region.

In general, when apertures are used for degassing purposes, a minimum aperture area per unit area of conductive layer is used to accomplish the degassing function. In the embodiment of FIG. 6, the apertures on conductive layer 400 are such that a substantially constant amount of aperture area exists per unit area of conductive layer 400. For example, in areas where signal traces are more closely packed, such as the right-most area of FIG. 6, the areas of enlargement about the reasons of intersection are smaller to allow for more aperture area. Conversely, in areas where signal traces are less densely packed, such as the left-most region of conductive layer 400, the areas of enlargement about the regions of intersection are larger to reduce the area encompassed by the apertures.

By designing conductive layer 400 such that regions of intersection have been removed, signal trace impedance is more tightly controlled. Each signal trace traverses the signal routing layer without crossing an aperture in the conductive layer. This reduces discontinuities in the characteristic impedance of each trace, and reduces the variation of characteristic impedance from trace to trace.

Figure 7:
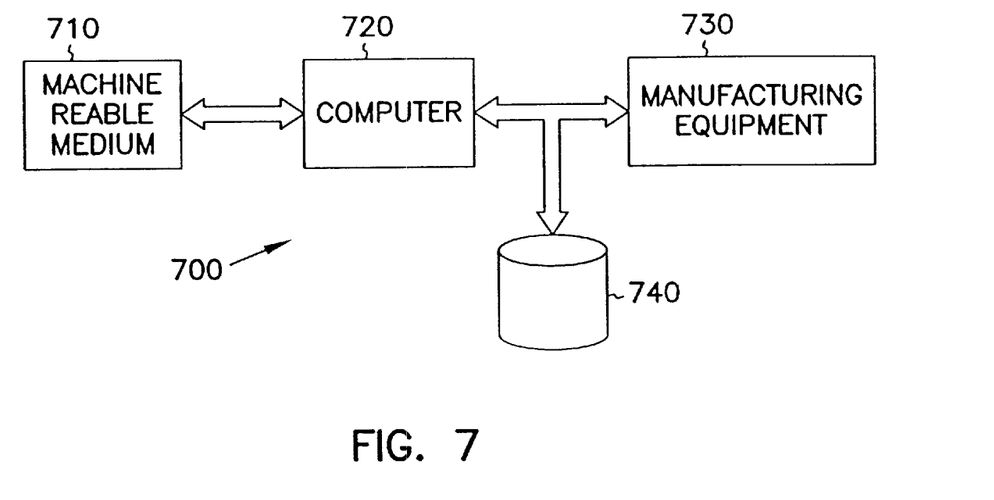
FIG. 7 is a computer system used in the design of semiconductor device packages.

FIG. 7 shows a processing system for designing and manufacturing semiconductor packages in accordance with one embodiment of the present invention. Processing system 700 includes computer 720, machine readable medium 710, storage system 740, and manufacturing equipment 730. Computer 720 automates the design process as described with reference to FIGS. 4–6. Machine readable medium 710 is a medium which includes instructions for computer 720. Machine readable medium 710 can be a disk, memory, or other means for storing information. Computer 720 can be directly connected to manufacturing equipment 730 as shown in FIG. 7, or can be connected to storage system 740 in lieu thereof, or both. When computer 720 is directly connected to manufacturing equipment 730, commands in the form of layer information and polygon location and size are transmitted from computer 720 to manufacturing equipment 730. When computer 720 is not directly connected to manufacturing equipment 730, the same commands from computer 720 can be stored on storage system 740. In this embodiment, manufacturing equipment 730 accesses information from storage system 740 at a later time. Database formats for defining polygons and traces are well known in the art and are not further described here.

Computer 720 can be a desktop computer such as a PC compatible, a Unix workstation, or the like. In these embodiments, users typically operate computer 720 and store design information on storage system 740. Information from storage system 740 is transferred to a manufacturing establishment which couples the information to manufacturing equipment 730 to complete the design and manufacturing process. In another embodiment, computer 720 is a special purpose computer that is dedicated to the task of design. In this embodiment, computer 720 is often permanently affixed to manufacturing equipment 730.

Figure 8:
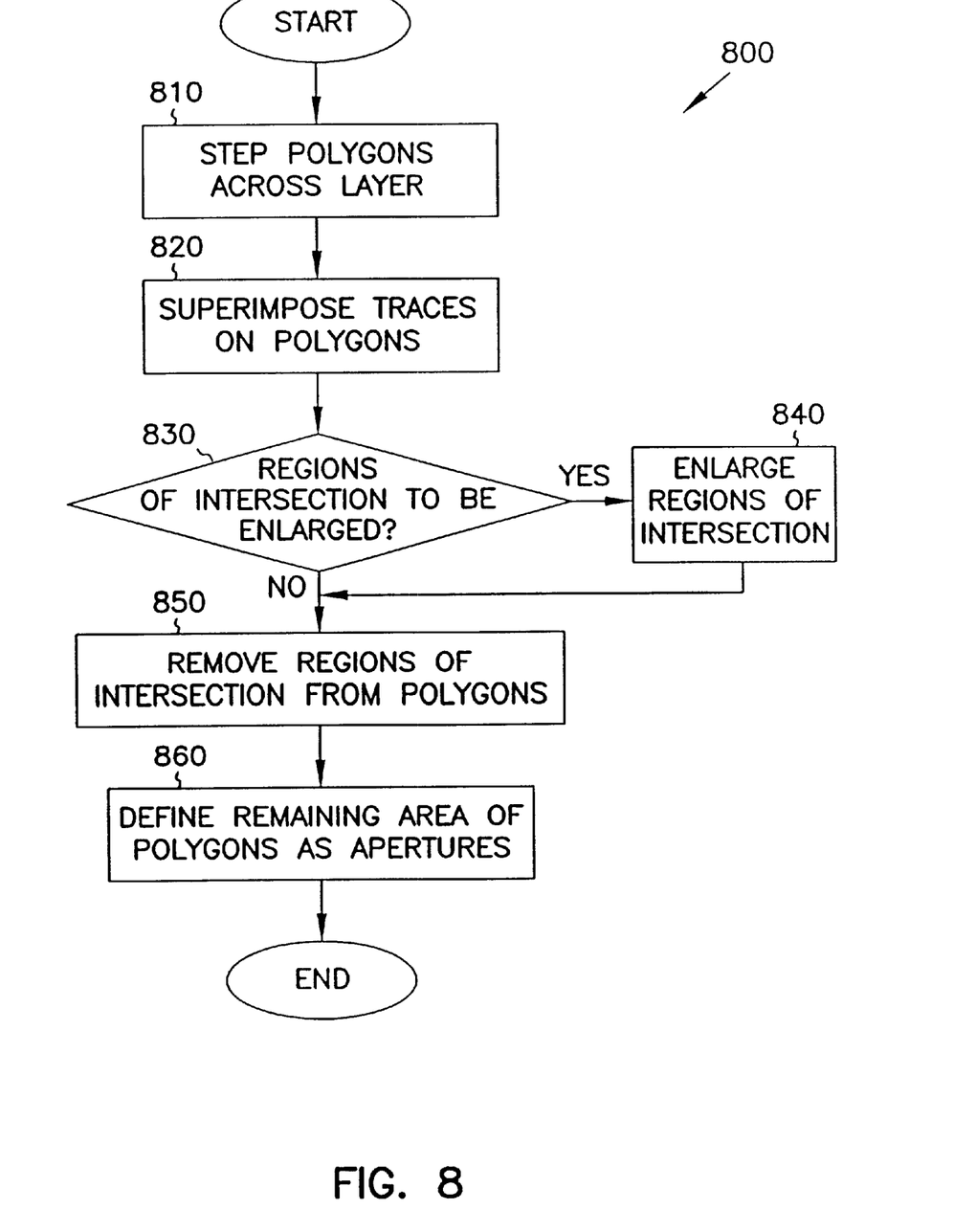
FIG. 8 is a flowchart of a method for designing semiconductor device packages in accordance with one embodiment of the invention.

FIG. 8 shows a flowchart of a method for designing a semiconductor package in accordance with an embodiment of the present invention. Method 800 can be carried out by computer system 700 (FIG. 7). In this embodiment, actual traces and layers are not manipulated, but rather data structures which represent layers and traces within computer 720 are manipulated until the desired result is achieved.

In action box 810, polygons are stepped across a layer. The polygons can be complex polygons, or simple polygons such as rectangles. When the polygons are rectangles, the layer appears as conductive layer 400 (FIG. 4) having polygons regularly spaced from each other in their minor dimension. In action box 820, signal traces are superimposed on the polygons. At this point in the design process the location of signal traces can be determined by a signal routing algorithm, or they can be retrieved from a data structure. After traces are superimposed on polygons, the design representation is that of conductive layer 400 in FIG. 5A. At points where traces cross polygons, regions of intersection are created, such as region of intersection 520 as shown in FIG. 5B In decision box 830, the decision is made as to whether regions of intersection are to be enlarged. If the regions of intersection are to be enlarged, they are enlarged in action box 840. Generally, regions of intersection are enlarged in the direction of the major dimension, as shown by areas of enlargement 535 and 540 in FIG. 5B. After enlarging regions of intersection, or if the regions of intersection are not to be enlarged, the regions of intersection are removed from the polygons. When regions of intersection are removed from polygons, what was once a single polygon can become multiple polygons. For example, as illustrated in FIG. 6, multiple smaller polygons replace what was once one larger polygon after the regions of intersection are removed. The remaining polygons can be rectangles, parallelograms, or irregular polygons depending on the shape of the original polygon, the angle at which traces traverse the polygons, and the amount of enlargement of regions of intersection.

In action box 860, the remaining area of polygons is defined as apertures on the conductive layer. As previously described, areas of enlargement can be manipulated such that the resulting area of polygons can be substantially constant per unit area of conductive layer.

CONCLUSION

A manual method and a computer-implemented method for designing semiconductor chip packages has been described. The method includes stepping polygons across a representation of a conductive layer. A signal routing layer that includes signal traces is then superimposed on the conductive layer. Signal traces overlap the polygons creating regions of intersection that can be enlarged. Regions of intersection are removed from the polygons such that the remaining polygons do not overlap the signal traces. The remaining polygons are designated as locations for apertures in the conductive layer. A semiconductor device package and packaged integrated circuit have also been described. Apertures exist in a conductive layer such that the apertures generally form a radial pattern outward from a region on the package. Signal traces also traverse the package generally radially outward such that the traces and the apertures do not overlap.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A semiconductor device package comprising:
   a first dielectric layer having a first side and an opposing side;
   a plurality of metal traces disposed on the first side of the first dielectric layer, wherein the plurality of metal traces are routed generally radially outward from a first region on the package; and
   a first conductive layer disposed on the opposing side of the first dielectric layer, the first conductive layer having apertures extending through the first conductive layer, the apertures being positioned generally in a radial pattern in the first conductive layer outward from the first region, the apertures in the first conductive layer lying between adjacent metal traces on the first side of the first dielectric layer such that the adjacent metal traces on the first side of the first dielectric layer do not overlap the apertures in the first conductive layer.

2. The semiconductor device package of claim 1 wherein each of the apertures is spaced substantially equidistant from adjacent metal traces.

3. The semiconductor device package of claim 1 wherein the first dielectric layer comprises a material that gives off a gas, and the apertures in the first conductive layer are degassing holes.

4. The semiconductor device package of claim 1 further including a core disposed on the first conductive layer opposite the first dielectric layer, the core having vias extending through the core, the vias coupling the plurality of metal traces to a plurality of contact points.

5. The semiconductor package of claim 4 wherein the plurality of contact points form a ball grid array (BGA) footprint.

6. The semiconductor device package of claim 4 wherein the plurality of contact points form a pin grid array (PGA) footprint.

7. The semiconductor device package of claim 1 further comprising:
a second dielectric layer disposed on the metal traces such that the second dielectric is in contact with the metal traces and the first dielectric layer; and
a second conductive layer disposed on the second dielectric layer.

8. The semiconductor device package of claim 7 wherein the second conductive layer has apertures positioned substantially identical to the positioning of the apertures on the first conductive layer.

9. An integrated circuit comprising:
a semiconductor die;
a package having a die mounting region, the semiconductor die being mounted to the package in the die mounting region, wherein the package comprises:
a first dielectric layer having a first side and an opposing side;
a plurality of metal traces disposed on the first side of the first dielectric layer, wherein the plurality of metal traces are routed generally radially outward from the die mounting region; and
a first conductive layer disposed on the opposing side of the dielectric layer, the first conductive layer having apertures extending through the first conductive layer, the apertures being positioned generally in a radial pattern in the first conductive layer outward from the die mounting region, the apertures in the first conductive layer lying between adjacent metal traces on the first side of the first dielectric layer such that the adjacent metal traces on the first side of the first dielectric layer do not overlap the apertures in the first conductive layer.

10. The integrated circuit of claim 9 wherein each of the apertures is spaced substantially equidistant from adjacent metal traces.

11. The integrated circuit of claim 9 wherein the first dielectric layer comprises a material that gives off a gas, and the apertures in the first conductive layer are degassing holes.

12. The integrated circuit of claim 9 further including a core disposed on the first conductive layer opposite the first dielectric layer, the core having vias extending through the core, the vias coupling the plurality of metal traces to a plurality of contact points.

13. The integrated circuit of claim 12 wherein the plurality of contact points form a ball grid array (BGA) footprint.

14. The integrated circuit of claim 12 wherein the plurality of contact points form a pin grid array (PGA) footprint.

15. The integrated circuit of claim 12 further comprising:
a second dielectric layer disposed on the metal traces such that the second dielectric is in contact with the metal traces and the first dielectric layer; and
a second conductive layer disposed on the second dielectric layer.

16. A multi-chip package comprising:
a plurality of mounting regions;
a first dielectric layer having a first side and an opposing side;
a plurality of sets of metal traces, each set associated with a separate one of the plurality of mounting regions, each set having a plurality of metal traces disposed on the first side of the first dielectric layer, wherein the plurality of metal traces of each set are routed generally radially outward from the mounting region associated with each set; and
a first conductive layer disposed on the opposing side of the first dielectric layer, the first conductive layer having apertures extending through the first conductive layer, the apertures being positioned generally in a radial pattern in the first conductive layer outward from each mounting region, the apertures in the first conductive layer lying between adjacent metal traces on the first side of the first dielectric layer such that the adjacent metal traces on the first side of the first dielectric layer do not overlap the apertures in the first conductive layer.

17. The multi-chip package of claim 16 wherein each of the apertures is spaced substantially equidistant from adjacent metal traces.

18. The multi-chip package of claim 16 wherein the first dielectric layer comprises a material that gives off a gas, and the apertures in the first conductive layer are degassing holes.

19. The multi-chip package of claim 16 further including a core disposed on the first conductive layer opposite the first dielectric layer, the core having vias extending through the core, the vias coupling the plurality of metal traces in each set of metal traces to a plurality of contact points.

20. The multi-chip package of claim 19 wherein the plurality of contact points form a ball grid array (BGA) footprint.

21. The multi-chip package of claim 19 wherein the plurality of contact points form a pin grid array (PGA) footprint.

22. The multi-chip package of claim 19 further comprising:
a second dielectric layer disposed on the metal traces such that the second dielectric is in contact with the metal traces and the first dielectric layer; and
a second conductive layer disposed on the second dielectric layer.

23. The multi-chip package of claim 22 wherein the second conductive layer has apertures positioned substantially identical to the positioning of the apertures on the first conductive layer.

24. The multi-chip package of claim 16 wherein at least one of the plurality of metal traces in each set of metal traces is coupled to at least one of the plurality of metal traces in another set.

25. An circuit comprising:
a plurality of semiconductor die;
a multi-chip package having a plurality of mounting regions, each semiconductor die being mounted to a separate one of the plurality of mounting regions, wherein the multi-chip package comprises:
a first dielectric layer having a first side and an opposing side;
a plurality of sets of metal traces, each set associated with a separate one of the plurality of mounting regions, each set having a plurality of metal traces disposed on the first side of the first dielectric layer, wherein the plurality of metal traces of each set are routed generally radially outward from the mounting region associated with each set; and a first conductive layer disposed on the opposing side of the first dielectric layer, the first conductive layer having apertures extending through the first conductive layer, the apertures being positioned generally in a radial pattern in the first conductive layer outward from, each mounting region, the apertures in the first conductive layer lying between adjacent metal traces on the first side of the first dielectric layer such that the adjacent metal traces on the first side of the first dielectric layer do not overlap the apertures in the first conductive layer.

26. The circuit of claim 25 wherein each of the apertures is spaced substantially equidistant from adjacent metal traces.

27. The circuit of claim 25 wherein the first dielectric layer comprises a material that gives off a gas, and the apertures in the first conductive layer are degassing holes.

28. The circuit of claim 25 further including a core disposed on the first conductive layer opposite the first dielectric layer, the core having vias extending through the core, the vias coupling the plurality of metal traces in each set of metal traces to a plurality of contact points.

29. The circuit of claim 28 wherein the plurality of contact points form a ball grid array (BGA) footprint.

30. The circuit of claim 28 wherein the plurality of contact points form a pin grid array (PGA) footprint.

31. The circuit of claim 25 further comprising:

a second dielectric layer disposed on the metal traces such that the second dielectric is in contact with the metal traces and the first dielectric layer; and a second conductive layer disposed on the second dielectric layer.

32. The circuit of claim 31 wherein the second conductive layer has apertures positioned substantially identical to the positioning of the apertures on the first conductive layer.

33. The circuit of claim 25 wherein at least one of the plurality of metal traces in at least one set of metal traces is coupled to at least one of the plurality of metal traces in at least another set.

* * * * *

UNITED STATES PATENT AND TRADEMARK OFFICE
CERTIFICATE OF CORRECTION

PATENT NO. : 6,392,301 B1
DATED : May 21, 2002
INVENTOR(S) : Alex Waizman, Chee-Yee Chung and Robert L. Sankman It is certified that error appears in the above-identified patent and that said Letters Patent is hereby corrected as shown below:

<u>Title page, Item [54] and Column 1, line 1,</u>
Title, delete "AND METHOD" and insert -- HAVING METAL TRACES NOT OVERLAPPING APERTURES --, therefor.
Item [22], under "Filed", delete "Oct. 25, 1999" and insert -- Oct. 22, 1999 --, therefor.
Item [57] , ABSTRACT,
Line 19, insert -- a -- before "trace", therefore.

<u>Column 7,</u>
Line 58, insert -- . -- (after FIG. 5B), therefor.

<u>Column 9,</u>
Line 62, delete "12" and insert -- 9 --, therefor.

<u>Column 10,</u>
Line 42, delete "19" and insert -- 16 --, therefor.
Line 57, delete "An" and insert -- A --, therefore.

<u>Column 11,</u>
Line 10, delete "," after "from", therefor.

Signed and Sealed this

Tenth Day of September, 2002

*Attest:*

JAMES E. ROGAN
*Attesting Officer*  *Director of the United States Patent and Trademark Office*